United States Patent [19]

Hilbert

[11] 4,377,728

[45] Mar. 22, 1983

[54] PHASE LOCKED LOOP WITH IMPROVED LOCK-IN

[75] Inventor: Francis H. Hilbert, Addison, Ill.

[73] Assignee: Motorola Inc., Schaumburg, Ill.

[21] Appl. No.: 240,445

[22] Filed: Mar. 4, 1981

[51] Int. Cl.³ .......................... H04H 5/00; H03D 3/18
[52] U.S. Cl. .................................. 179/1 GS; 329/112; 329/124; 455/209; 455/260
[58] Field of Search ............ 179/1 GS; 329/112, 122, 329/123, 124, 125; 455/205, 208, 209, 260, 264-266

[56] References Cited

U.S. PATENT DOCUMENTS

| | | | |
|---|---|---|---|
| 3,610,954 | 10/1971 | Treadway . | |
| 3,909,735 | 9/1975 | Anderson et al. | 329/122 |
| 4,057,762 | 11/1977 | Namiki | 329/124 X |
| 4,117,410 | 9/1978 | Bender | 329/122 X |
| 4,213,096 | 7/1980 | Daniel | 455/260 |
| 4,253,180 | 2/1981 | Kimbrough | 455/260 X |
| 4,270,221 | 5/1981 | Daniel | 329/124 X |

OTHER PUBLICATIONS

"Color-Carrier Reference Phase Synchronization Accuracy in NTSC Color Television", Donald Richman, Proceedings of the I-R-E.

"The DC Quadricorrelator: A Two-Mode Synchronization System", Donald Richman, Proceedings of the I-R-E.

Primary Examiner—A. D. Pellinen
Attorney, Agent, or Firm—Margaret Marsh Parker; James S. Pristelski; James W. Gillman

[57] ABSTRACT

The circuit determines whether an incoming frequency is within the normal "lock-in" range of a phase locked loop VCO or not, and whether it is higher or lower than the VCO frequency. If not within normal range, the beats are rectified and gated to provide a DC control voltage of the proper value and polarity for locking the oscillator on the incoming frequency. Rectification may be half or full wave as needed, and the circuit may include filter bandwidth control as well. This circuit is suitable for signals of any waveform, quadrature signals, and AM stereophonic signals.

12 Claims, 6 Drawing Figures

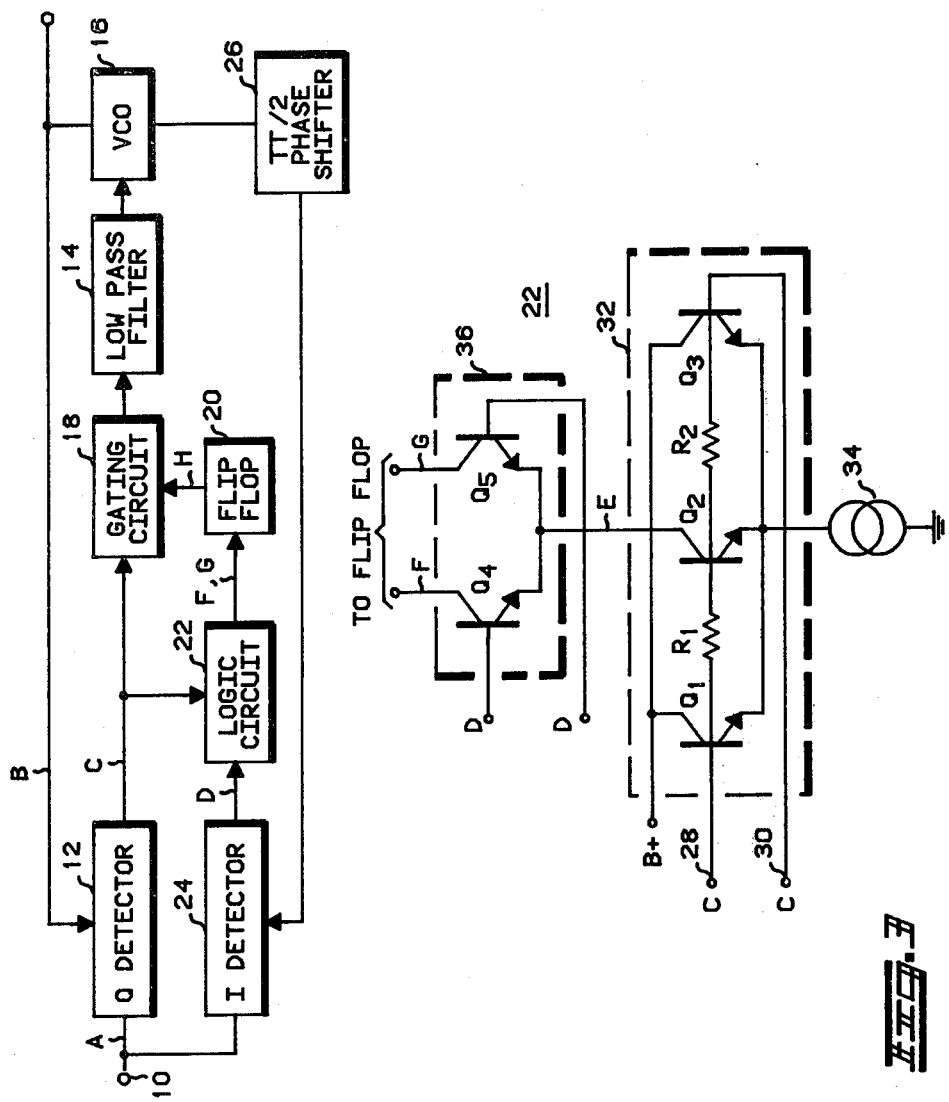

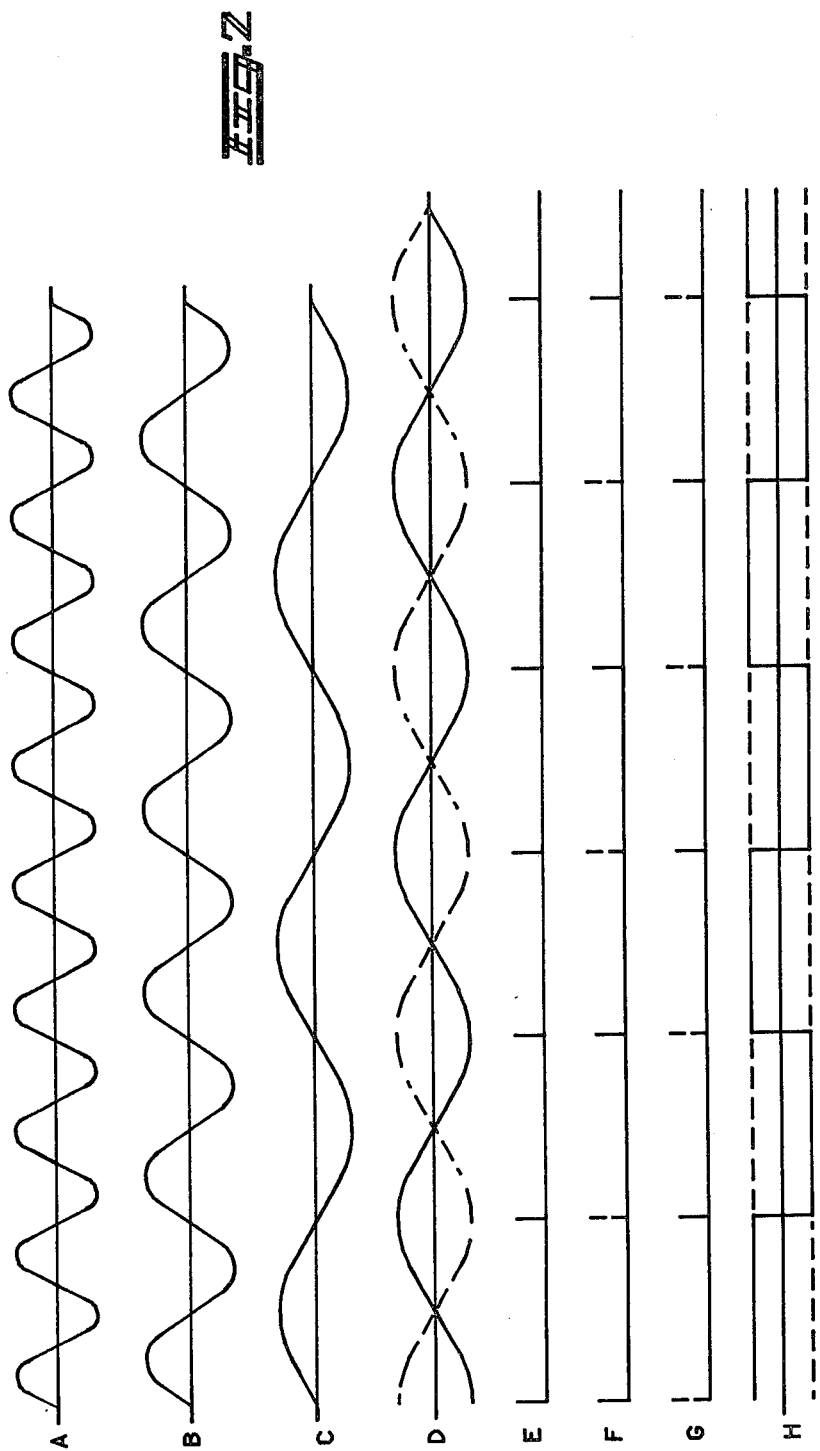

PHASE LOCKED LOOP WITH IMPROVED LOCK-IN

BACKGROUND OF THE INVENTION

This invention relates to the field of phase locked loops and, more particularly, to means of providing fast "pull-in" even if the locking signal and VCO reference frequency differ by a frequency substantially higher than the bandwidth of the control filter.

A conventional phase locked loop may have a relatively narrow "lock-in" range, determined largely by the band-width of the filter. Considerations of stability and pull-in time also limit the range of a PLL. There have been many modifications made to PLL circuits over the years since they were first developed. One of these was the "quadricorrelator" which was developed for use with the NTSC color television signals to provide automatic color synchronization. The quadricorrelator included a beat detector and means for changing the bandwidth of the filter when the oscillator was not locked to the frequency of the incoming signal. In another improvement circuit, a plurality of NAND gates was utilized to detect the trailing edges of the two input signals and provide a DC signal to the VCO. While partially successful, this circuit provides a small "dead spot" in the close-in range, and thus will not provide the phase accuracy necessary for cases where the phase relationship between the VCO and the locking signal must be accurately maintained.

SUMMARY OF THE INVENTION

It is therefore an object of the present invention to provide a fast lock-in of a PLL together with a wide pull-in range.

It is a particular object to provide these in a receiver for AM stereo signals.

These objects and others are provided in a circuit in accordance with the present invention wherein the PLL includes an in-phase detector, a quadrature detector, a filter coupled to the quadrature detector output and an oscillator controlled by the filter output. One oscillator output is coupled to the quadrature detector and a phase shifted output is coupled to the in-phase detector. A logic circuit is coupled to the detector outputs and detects beats between the two. The logic circuit also determines whether the VCO is too high or too low and provides a control signal to a gating circuit coupled between the quadrature detector and the filter. If the received frequency is out of the lock-in range of the VCO, the detector signals are rectified via the gating circuit to provide a DC signal of the proper polarity to pull the VCO frequency to the proper frequency.

BRIEF DESCRIPTION OF THE DRAWING

FIG. 1 is a block diagram of a PLL including the invention.

FIG. 2 is a timing chart of the signals for the diagram of FIG. 1.

FIG. 3 is a circuit diagram of one embodiment of the logic circuit of FIG. 1.

DETAILED DESCRIPTION OF A PREFERRED EMBODIMENT

Figure 4:
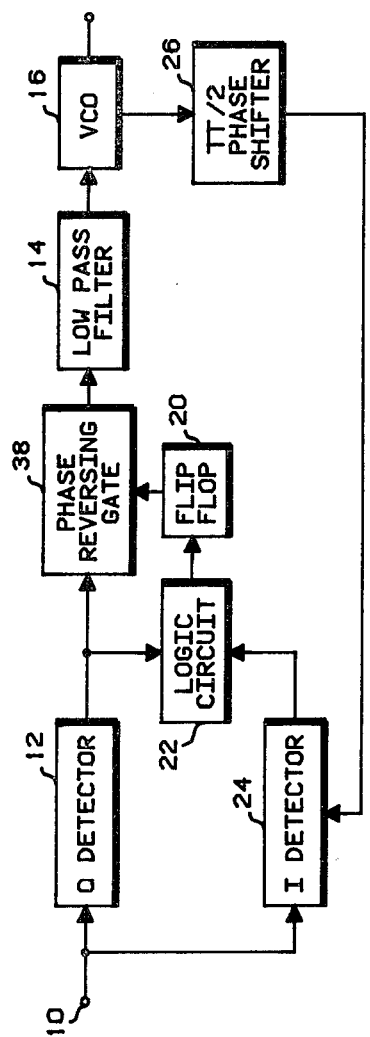
FIG. 4 is a variation of the block diagram of FIG. 1.

The block diagram of FIG. 1 shows a phase locked loop including the invention. At an input terminal 10, a signal is received as from the IF stage of a radio receiver (see FIG. 6) and is coupled to a PLL consisting of a phase detector 12, a low-pass filter 14, and a voltage controlled oscillator 16. These elements of the PLL operate as in the usual PLL, but inserted between the phase detector 12 and the filter 14 is a gating circuit 18. The gating circuit is coupled to a flip-flop 20, a logic circuit 22 and a second phase detector 24. The output of the VCO is coupled back to the phase detector 12 and, through a 90° phase shifter 26, to a phase detector 24. Phase detector 12 is termed the "Q" detector (quadrature), and phase detector 24, the "I" detector (in-phase), for reasons which will become apparent hereinafter.

The circuit functions as a phase detector when the PLL is locked to the frequency of the incoming signal, but as a frequency detector when there is a significant difference between the frequencies. The gating circuit 18 allows the phase detector 12 output to be coupled directly to the filter 14 for controlling the VCO 16 during "lock". When the radio receiver is not tuned closely enough to the VCO frequency for fast lock-in to occur, the circuit determines whether the VCO frequency is too high or too low and couples a modified control signal to the filter which will provide a fast lock-in.

FIG. 2 is a timing chart of signals which relate to the block diagram of FIG. 1 and which represent the out-of-lock condition. Signal A represents the incoming carrier ($f_A$) at the terminal 10. This carrier signal may be wave-shaped or not, but for simplicity of drawing it is shown here as sinusoidal. Signal B represents the output of the VCO at two thirds the incoming frequency ($2f_A/3$). Signal C is the beat ($f_A/3$) produced by multiplying the incoming signal A by signal B. Signal D represents the beat produced by multiplying signal A by the phase shifted signal B. It should be noted here that signal D will lead or lag signal C depending on whether the VCO frequency is higher or lower than the incoming signal, as indicated by the solid and dashed lines, respectively. The pulses of signal E represent the zero crossings of signal C (see FIG. 3). Signals F and G are the two separate output signals of the logic circuit 22 which are coupled to the Set and Reset inputs of the F/F 20. Signal H is the output of the F/F 20 and is the control signal for the gating circuit 18.

FIG. 3 is a circuit diagram of the preferred embodiment of the logic circuit 22. The output signal C of the Q detector 12 (FIG. 1) is coupled to inputs 28, 30 of a zero crossing detector 32. Transistors Q1, Q2 and Q3 are coupled to a current source 34. Two resistors R1, R2 form a divider across the terminals 28, 30 and the bases of the transistors are coupled to the ends and the center of the divider.

When signal C (from detector 12) is positive, the current from the current source 34 is steered through Q1 to B+; when C is negative, the current is steered through Q3. When C is approximately 0 (at the zero crossings) current passes through all three transistors and the Q2 current is coupled to a steering gate 36. The output of Q2 is signal E of FIG. 2. The gate 36, comprised of Q4, Q5 is controlled by the output (signal D) of the I detector 24. If D is positive when the zero crossing occurs, signal E is steered through Q4 (as signal F) to the "Set" input of the F/F 20. If D is negative when the zero crossing occurs, signal E is steered through Q5 as signal G to the "Reset" input of the F/F. In signals F, G, the solid line pulses represent the "above frequency" condition, while the dashed line pulses represent "below frequency". The output of the F/F (signal H) is represented by the solid line when the incoming signal is high, and by the dashed line when the incoming signal is low. With the signal H controlling the gating circuit 18, the signals from the Q detector 12 are rectified before being coupled to the filter 14. The polarity of the gate output signals is determined by whether the incoming signal leads or lags the VCO frequency. While the output signals from the Q detector 12 would be of too high a frequency to pass through the low-pass filter 14 (when the incoming signal is out of lock-in range), the rectified signals will provide the proper filter output to lock the VCO at the proper frequency. When the VCO reaches the locked-in condition, the beats (signal C) will go to zero and the gating circuit 18 will remain in the closed position. No signals are shown for the "locked" condition, since the PLL will function as it normally would when locked.

FIG. 4 is a block diagram as in FIG. 1, wherein the outputs of the detectors 12, 24, instead of being half wave rectified, are full wave rectified, since the simple gating circuit 18 is now replaced by a phase reversing gate 38, also controlled by the signal H. In some environments, this embodiment may be preferred since it provides a higher control voltage for the VCO, thus even faster lock-in.

Figure 5:
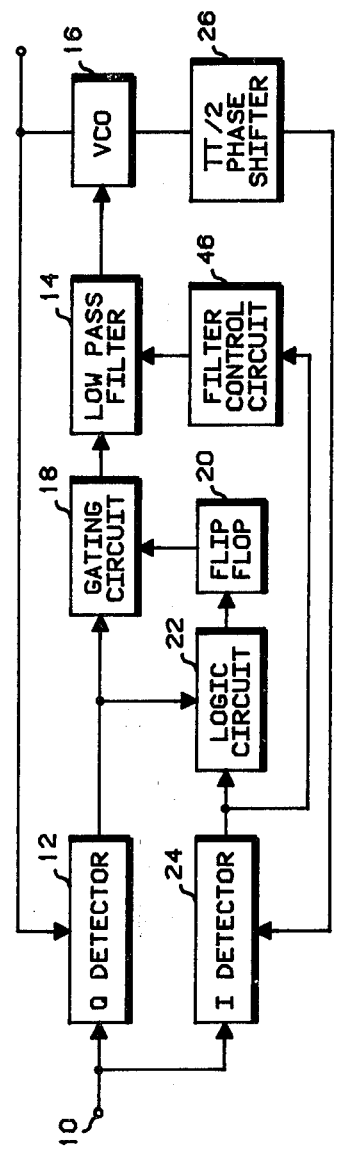
FIG. 5 is similar to FIG. 1, with added features.

FIG. 5 is a block diagram similar to that of FIG. 1, but with the addition of a control for the filter bandwidth. A filter control circuit 46 is coupled to the output of the detector 24 and is used to control the bandwidth of the filter. While the output of the detector 12 can be used for activating the change of bandwidth in response to the locked or unlocked condition of the PLL, the output signal of the detector 24 is preferred. Such bandwidth control is known and is discussed in the Background of the Invention herein above. In the present circuit, bandwidth would likely be changed from "normal" to "narrower", rather than from "wider" to "normal", thus providing faster lock-in rather than wider pull-in range.

Figure 6:
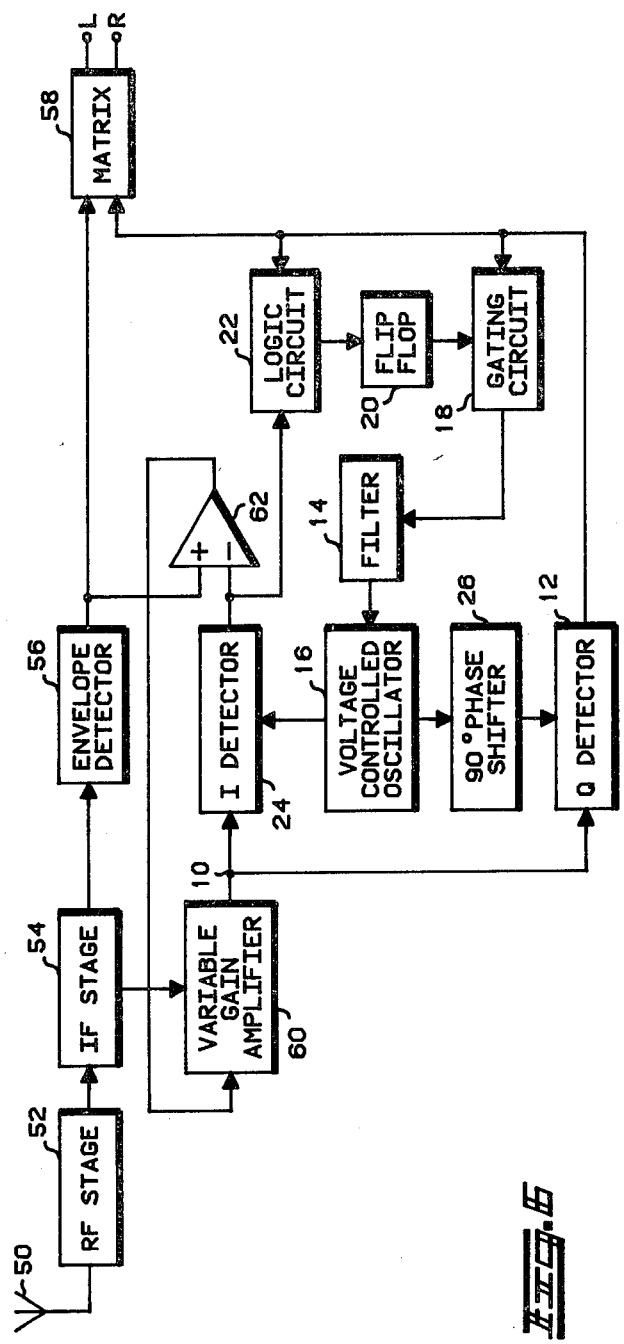
FIG. 6 is a block diagram of an AM stereo receiver including the invention.

FIG. 6 is a block diagram of an AM stereo receiver such as is shown in a co-pending U.S. patent application Ser. No. 133,189, assigned to the assignee of the present invention, integrated with the present invention.

The receiver shown is designed to receive a compatible AM stereo signal of the form $(1+L+R) \cos(w_c t + \phi)$ where $\phi$ is arc tan $[(L-R)/(1+L+R)]$. In the receiver, an antenna 50 receives the compatible AM stereo signal as given above, and this signal is processed in the usual fashion in RF stage 52 and IF stage 54. The monophonic or sum signal L+R is obtained by coupling the output of the IF stage to an envelope detector 56. The L+R signal is then coupled to a matrix 58. The output of the IF stage 54 is also coupled through a variable gain amplifier 60 to the I detector 24 and to the Q phase detector 12. An output of the VCO 16 ($\cos w_c t$) is coupled to the I detector 24 and to the 90° phase shifter 26. The phase shifter output ($\sin w_c t$) is coupled to the Q detector 12.

The output of the envelope detector 56 is coupled to a high gain operational amplifier 62. The inverting input of the amplifier 62 is coupled from the output of the I detector 24 which is also coupled to the logic circuit 22.

The output of the amplifier 62 is coupled to the variable gain amplifier 60, and this feedback loop forces the output signal of the amplifier 62 to become 1+L+R. This amounts to a multiplication of the amplifier 60 output by a correction factor of $1/\cos \phi$. Since the output signal of the Q detector 12 would be $(L-R) \cos \phi$ without the correction, the corrected output signal is L−R. This L−R signal is coupled to the matrix 58 which then provides separated L and R output signals.

As described above with respect to FIG. 1, the outputs of the I detector 24 and the Q detector 12 are coupled to the logic circuit 22. The output of the logic circuit (signals F, G) are coupled to the set and reset of the F/F 20, and the output (signal H) of the F/F controls the gating circuit 18. The output of the gating circuit is, again, the signal which, coupled through the low-pass filter 14, controls the VCO 16.

It will be apparent that the "full-wave rectification" of the circuit of FIG. 4 could also be employed in the receiver of FIG. 6. In either case, the two detectors, in-phase and quadrature, used for determining the sum L+R and difference L−R signals of the AM stereophonic receiver can also supply the signals necessary for providing wide pull-in range and fast lock up of the PLL. This improved PLL is also applicable to other AM stereo receivers as well.

In the context of an AM stereo receiver, it is particularly desirable to have a PLL which locks up quickly on the incoming frequency, even when the receiver is poorly tuned. (With pushbutton radios, tuning errors of 2 kHz are not unusual.) A PLL with a wide pull-in range and fast lock-in has many other applications in such fields as FM stereo, television and frequency synthesizers.

Thus there has been shown and described a circuit for improving the operation of a phase locked loop in almost any environment, and an AM stereo receiver wherein the in-phase and quadrature detectors serve the dual purpose described above. Other variations and modifications are possible, particularly in the logic elements, and it is intended to cover all such as fall within the spirit and scope of the appended claims.

What is claimed is:

1. A phase locked loop comprising:
   input means;
   first, in-phase detector means coupled to the input means;
   second, quadrature detector means coupled to the input means;
   filter means coupled to the second detector means output;
   oscillator means coupled to be controlled by the filter means output, for providing two output signals in quadrature to the first and second detector means respectively;
   logic means coupled to the outputs of the first and second detector means for detecting beats between said output signals, for detecting the relative phase of said signals, and for providing a control signal in response to said detection; and
   gating means coupled to control the connection between the second detector means and the filter means in response to the control signal from the logic means.

2. A phase locked loop in accordance with claim 1 and wherein the filter means is a low-pass filter.

3. A phase locked loop in accordance with claim 1 and wherein the logic means includes third detector means for detecting the zero crossings of the second detector means output signal, steering means and bistable means, the steering means coupled to steer the third detector means output signal to the respective inputs of the bistable means in response to the output signal of the first detector means.

4. A phase locked loop in accordance with claim 1 wherein the logic means further includes a current source, first transistor means coupled to the second detector means for providing a first signal in response to the zero crossings of said detector means output signal, bistable means coupled to control the gating means, second transistor means coupled to the first transistor means, to the first detector means and to the bistable means for coupling said first signal to ones of the bistable means inputs in response to the instantaneous polarity of the first detector means output signal.

5. A phase locked loop in accordance with claim 1 wherein the gating means includes means for providing half-wave rectification of the signals from the second, quadrature detector in response to the control signal from the logic means.

6. A phase locked loop in accordance with claim 1 wherein the gating means includes means for providing full wave rectification of the signals from the second, quadrature detector in response to the control signal from the logic means.

7. A phase locked loop in accordance with claim 1 and further including filter bandwidth control means coupled to the output of one of the detector means and to the filter means for controlling the filter bandwidth in response to the first detector means output signal.

8. A phase locked loop in accordance with claim 7 wherein said one of the detector means is the first, in-phase detector means.

9. A phase locked loop in accordance with claim 1 wherein the first and second detector means are coupled to receive AM stereophonic signals and to provide output signals for use in decoding of the stereophonic signals.

10. A receiver for receiving AM stereophonic signals and comprising:
input means;
first, in-phase detector means coupled to the input means;
second, quadrature detector means coupled to the input means;
oscillator means coupled to provide two output signals in quadrature to the first and second detector means respectively;
filter means coupled to the second detector means output and coupled to the oscillator means input;
logic means coupled to the output of the first and second detector means for detecting beats between the output signals thereof, for detecting the relative phase of said output signals, and for providing a control signal in response to such detection;
gating means coupled to control the connection between the second detector means and the filter means in response to the control signal from the logic means;
correcting means coupled to correct the input signals of the first and second detector means; and
means coupled to the correcting means and to the detector means for deriving the original stereo signals.

11. A receiver in accordance with claim 10 wherein the correcting means includes third detector means for detecting the envelope modulation on the received signal, comparator means coupled to compare the output signals from the first and third detector means, circuit means coupled for correcting the input signals of the first and second detector means in response to the output signal of the comparator means.

12. A receiver in accordance with claim 10 wherein the means for deriving the original stereo signals includes matrixing means.

* * * * *